(12) United States Patent
Hilton et al.

(10) Patent No.: US 7,144,759 B1
(45) Date of Patent: Dec. 5, 2006

(54) TECHNOLOGY PARTITIONING FOR ADVANCED FLIP-CHIP PACKAGING

(75) Inventors: Robert M. Hilton, deceased, late of Queensland (AU); by Dzintra Hilton, legal representative, Queensland (AU); Mark L. DiOrio, Cupertino, CA (US)

(73) Assignee: Celerity Research Pte. Ltd., Singapore (SG)

( * ) Notice: Subject to any disclaimer, the term of this patent is extended or adjusted under 35 U.S.C. 154(b) by 0 days.

(21) Appl. No.: 11/096,552

(22) Filed: Apr. 1, 2005

Related U.S. Application Data

(60) Provisional application No. 60/559,220, filed on Apr. 2, 2004.

(51) Int. Cl.
*H01L 21/50* (2006.01)
(52) U.S. Cl. ..................................... 438/108
(58) Field of Classification Search ................ 438/106, 438/108, 110, 118, 125, 618, 622, 637
See application file for complete search history.

(56) References Cited

U.S. PATENT DOCUMENTS 6,759,268 B1 * 7/2004 Akagawa .................... 438/106

* cited by examiner

*Primary Examiner*—Scott B. Geyer
(74) *Attorney, Agent, or Firm*—David T. Millers

(57) ABSTRACT

Packaging processes and structures provide thin-film interconnects for high performance signal transmission of high frequency signals. The thin-film interconnects can be formed on a carrier that is at least partly removed for formation of terminals such as a BGA connected to the thin-film interconnects. Removal of the carrier can leave a frame for handling of the thin-film interconnects during subsequent processing. The thin film interconnects can be used to route signals to external terminals, between dies, or between functional units within a die. This allows the dies to contain fewer routing layers and allows configuration of a device such as an ASIC during packaging. A coarser pitch interconnect structure can be fabricated on the carrier using different technology for power and ground management and/or in a core that attaches to the thin-film package structure.

17 Claims, 6 Drawing Sheets

TECHNOLOGY PARTITIONING FOR ADVANCED FLIP-CHIP PACKAGING

CROSS-REFERENCE TO RELATED APPLICATIONS

This patent document claims benefit of the earlier filing date of U.S. provisional patent application No. 60/559,220, filed Apr. 2, 2004, which is hereby incorporated by reference in its entirety.

BACKGROUND

Integrated circuit packaging conventionally has served to protect semiconductor dies, to provide electrical connections to the integrated circuitry on the dies, and to provide external terminals of a size and spacing suitable for systems or applications. However, integrated circuit device packaging has become increasingly complex as the size of semiconductor dies has decreased and the number of external terminals and the operating frequencies of integrated circuits have increased. As a result, improper or inefficient packaging can prevent an integrated circuit from reaching optimal operating performance.

Flip-chip packages with terminals in the form of a ball grid array (BGA) have been developed to eliminate bond wires and provide a large number of external terminals within a small package footprint. Flip-chip packages also require careful design for routing of power, ground, and signals for a high-speed or RF integrated circuit. For example, power and ground management techniques generally require relatively large traces or leads, which can make routing and shielding other signals in packages difficult to achieve within a limited package area. New packaging techniques and structures are desired that can improve package performance within a small package footprint.

SUMMARY

In accordance with an aspect of the invention, a packaging process can form thin-film traces and other interconnect structures on a carrier containing sacrificial material. A semiconductor die can be flip-chip bonded to the interconnect structure before or after sacrificial material is removed from the carrier. Terminals such as bumps for a BGA can be attached to or formed on the traces or pads in the exposed areas where the sacrificial material was removed.

In accordance with a further aspect of the invention, removal of the sacrificial material from a carrier for formation of external terminals can leave a frame of the sacrificial material surrounding an area that corresponds to a package being fabricated. The frame facilitates handling of the interconnect structures during the fabrication process and can be trimmed off before the package is complete. The carrier can correspond to multiple device packages, and a process of dicing the carrier can separate individual packages and remove the frames.

In accordance with yet another aspect of the invention, a package can use fine pitch traces formed in the thin film layers for high-frequency signals and coarser pitch traces in the additional interconnect structure for supply voltage or ground management or for low frequency signals. The device's signals are thus partitioned into types and matched with the trace technology that provides the desired signal performance. The capabilities of the thin film traces can thus be used to their best advantage for low current and/or high frequency signals, while the coarser traces in the additional interconnect structure can accommodate power and ground management.

In accordance with still another aspect of the invention, a package containing thin film traces can be attached to a core containing coarse traces for external connections and/or to connections to one or more integrated circuit dies that are also attached to the core.

In accordance with a further aspect of the invention, the thin-film interconnect structures provide sufficiently high signaling performance to enable use of the packaging for signal transmission between functional blocks on the same semiconductor die. Accordingly, a semiconductor die containing functional blocks of a configurable ASIC can be connected to a package that selects and provides the routing of signals of the ASIC and thereby controls the configuration of the ASIC.

BRIEF DESCRIPTION OF THE DRAWINGS

Use of the same reference symbols in different figures indicates similar or identical items.

DETAILED DESCRIPTION

Figure 1A:
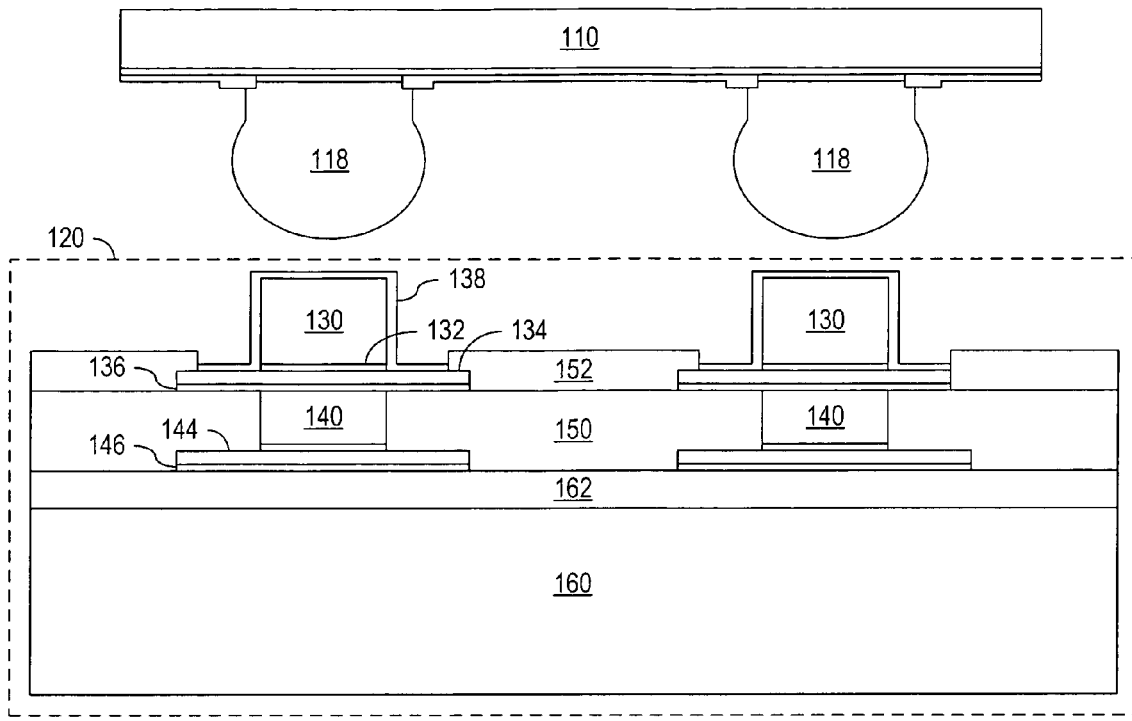
FIGS. 1A, 1B, and 1C show cross-sections of structure created during a packaging process in accordance with an embodiment of the invention using thin film traces.

In accordance with an aspect of the invention, a packaging process can form thin film traces and interconnect structures on a carrier including a sacrificial support material. FIG. 1A illustrates a portion of a semiconductor device 110 that is to be attached to a packaging substrate 120 in accordance with an embodiment of the invention.

Packaging substrate 120 includes a carrier with a sacrificial layer 160 made of a material such as copper or a copper alloy on which a stop layer 162 of a material such as nickel is formed. The carrier including sacrificial layer 160 and stop layer 162 is sufficiently rigid for processes that form a thin-film interconnect structure and is about 1.0 mm thick in an exemplary embodiment of the invention. As described further below, stop layer 162 can act as an etch stop to help control removal of all or portions of sacrificial layer 160 and can also be patterned to form pads for electrical connections to a BGA, solder balls, solder columns or other external electrical terminals.

An interconnect structure including an insulating layer 150, thin-film traces 134 and 144, and conductive vias 140 resides on stop layer 162. In an exemplary embodiment of the invention, insulating layer 150 is a low K dielectric such as Benzocyclobutene (BCB) or a BCB-based polymer dielectric. Thin-film traces 134 and 144 are typically made of a conductive material such as copper and may have barrier layers 136 and 146 of tungsten, tantalum, titanium or other suitable materials where traces 134 and 144 contact stop layer 162 or conductive vias 140. Vias 140 are made of a conductive material such as aluminum or copper. FIG. 1A illustrates an embodiment of the invention having conductive vias 140 and thin-film traces 134 and 144 for a single insulating layer 150, but alternatively the interconnect structure can include multiple layers of insulating material, conductive traces, and conductive vias.

The thin-film interconnect structure on stop layer 162 can be formed using known integrated circuit processing technology such as photolithography, which is applied to a carrier system as described. The carrier is particularly useful 1) to provide a base structure to which thin films can be applied and 2) to act as a carrier in the assembly process by which the thin film structure can be easily handled and assembled before the carrier is cut off or removed. Current thin-film and photolithography technologies can easily produce spaces and/or lines having widths of about 10 µm to 25 µm and via diameters down to 35 µm on an overall body size of 10×10 mm to 45×45 mm. Step and repeat lithography can pattern body areas for multiple device packages on a single carrier, for example, on a panel size up to 12"×12". As described further below, traces 134 and 144 generally have patterns that perform a space transform from the pitch of contact pads on die 110 to a larger pitch (e.g., a 0.8 mm pitch) for a BGA or other electrical terminals.

Conductive bumps 130 connect to underlying conductive plugs or vias 140 or traces/pads 134. In an exemplary embodiment, traces/pads 134 are made of a material such as copper, and an underlying barrier layer 136 and an overlying barrier layer 132 are between each via 140 and the corresponding bump 130. Bumps 130 have a pitch and pattern that matches the pitch and pattern of terminals 118 (e.g., solder balls formed using Solder-On-Pad (SOP) technology) on the semiconductor device 110 being packaged. For example, bumps 130 and terminals 118 can both have a pitch of about 180 µm. (In an alternative embodiment, bumps 130 can be formed on die 110, and solder balls can be formed on packaging substrate 120.) Bumps 130 can be made of any desired conductive material, for example, of aluminum, and may have a coating 138 (e.g., of nickel) to facilitate reliable soldering. A solder mask 152 made of a material such as a photopolymer dry film solder mask is around bumps 130 to limit the flow of solder when die 110 is attached to packaging substrate 120.

Figure 1B:
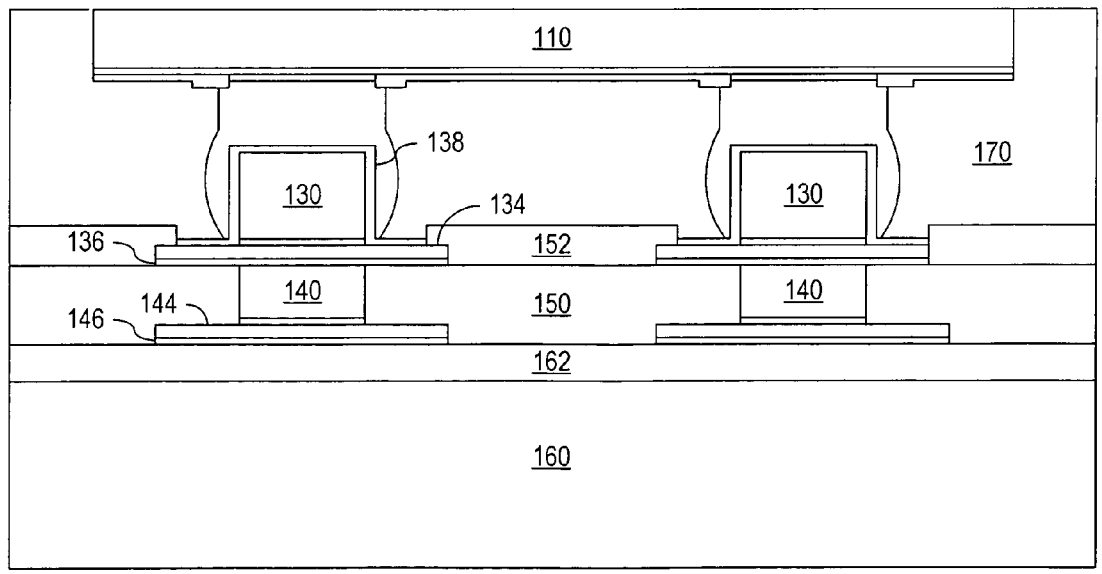

FIG. 1B illustrates the package structure after a solder reflow process and a fill process attach die 110 to packaging substrate 120. For the reflow process, solder balls 118 on die 110 are aligned with bumps 130, before the solder reflow process melts solder balls 118 causing the solder to wet and then bond to bumps 130. After the package cools, the fill process directs a filler material 170 such as curable liquid polymer to fill gaps between die 110 and substrate 120 and then cures filler material 170. As an alternative to or in addition to under filling, a molding process can encapsulate die 110 in a protective material.

Figure 1C:
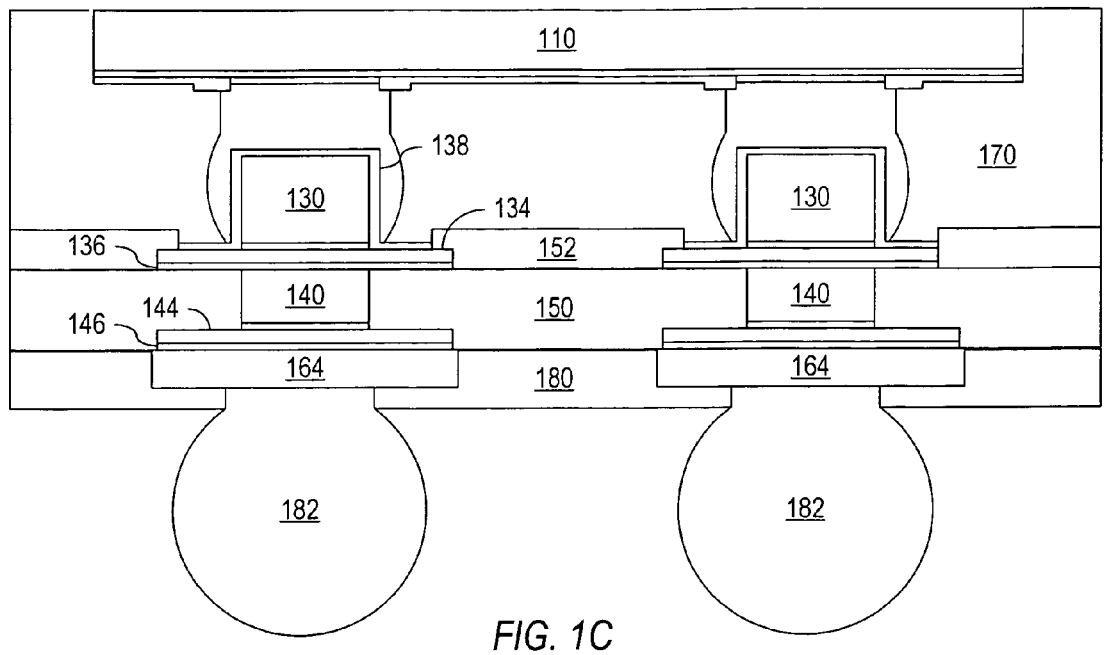

FIG. 1C shows the package structure after removal of all or portions of sacrificial layer 160 and patterning of stop layer 162 to form pads 164 for electrical connections. In an exemplary embodiment of the invention, a patterned etch process removes portions of layer 160 that correspond to package areas, but the patterned etch leaves a portion (not shown) of sacrificial layer 160 to form a rigid frame for support and handling of the structure that remains after the etching. The frame helps to prevent damage to the thin-film structures during subsequent processing, even though a total thickness of the package without the frame may be between about 150 µm and about 200 µm.

FIG. 1C also illustrates an embodiment of the invention in which conductive bumps 182, e.g., solder balls or metal-on-pad (MOP) structures, contact the thin film interconnect structure including vias 140 and traces 144 through pads 164. A patterned layer 180 of a solder mask material limits formation of solder balls or other terminals to desired locations on pads 164.

Table 1 indicates some of the typical dimensions, features, and advantages of package structure of FIG. 1C.

TABLE 1

| | |
|---|---|
| Body size: | 10 × 10 mm to 45 × 45 mm |
| BGA Pitch: | 0.8 mm to 1.5 mm |
| Bump Pitch: | 125 µm |
| Overall Package Thickness: | 150 µm to 400 µm |
| Substrate Thickness: | 25 µm to 150 µm |
| Metal on pad: | 50 µm diameter, Ni/Au Coated |
| Ball Material: | Solder or Copper with Solder Cap |
| Stacked Vias for High Current | Solid filled metal vias |
| Via Structure Inductance: | About 5.7 pH |
| Insulator Dielectric Constant: | 2.50 |
| Control of Dielectric Spacing: | <1.0 µm |

Figure 2A:
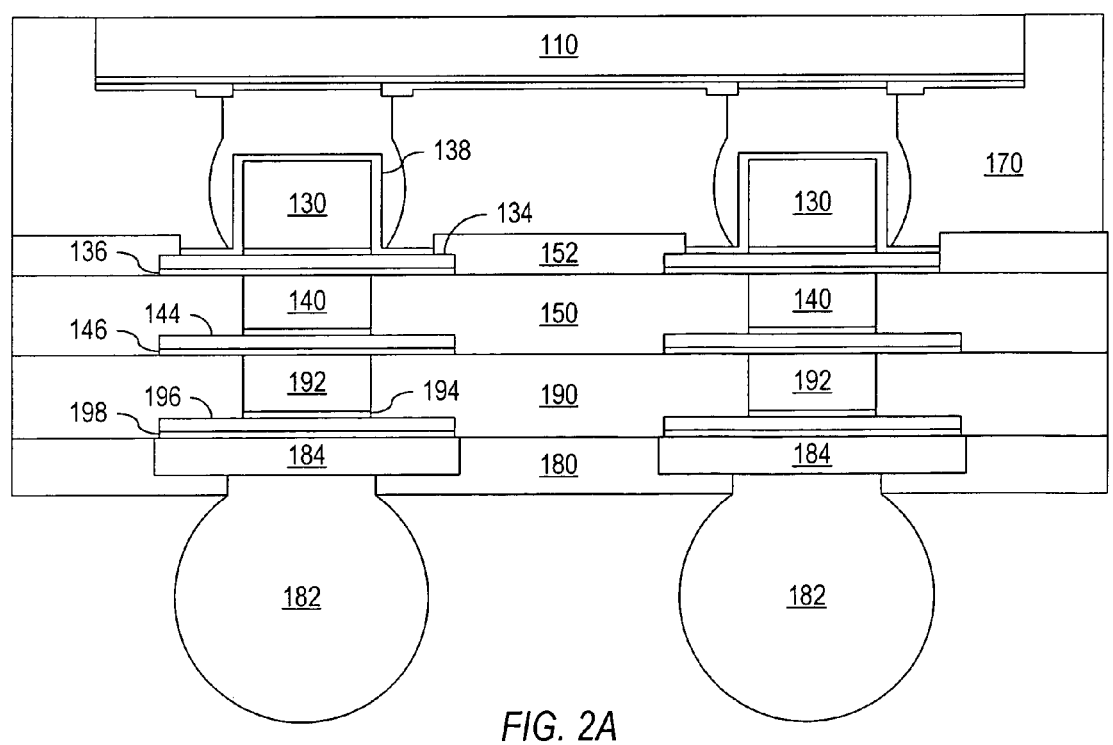
FIGS. 2A and 2B show cross-sections of alternative device packages in accordance with embodiments of the invention including one or more additional layers of traces.

FIG. 2A illustrates a portion of a device package 200A in accordance with an alternative embodiment of the invention. Package 200A includes components as described above in regards to FIGS. 1A, 1B, and 1C and further includes an additional interconnect structure including an insulating layer 190, conductive vias 192, and traces 196 with barrier layers 194 and 198 where appropriate. The additional interconnect structure can be fabricated on the carrier before formation of thin-film traces 134 and 144 or formed below thin-film traces 144 after removal of sacrificial layer 160. In an exemplary embodiment, insulating layer 190 comprises a material such as polyimide, and vias 192 and traces 196 are made of a conductive material such as copper. Conventional packaging processes such as application of polyimide tape can form the polyimide layer, and associated traces 196 and vias 192 can be fabricated through laser drilling and copper deposition by various technologies. Pads 184 can be formed from stop layer 162 or added where terminals 182 are desired on traces 196. A solder mask 180 and terminals 182 are formed using conventional bumping technology.

In general, insulating layer 190, conductive vias 192, and traces 196 can be fabricated using materials, techniques, or dimensions that differ from those used for insulating layer 150, vias 140, and traces 134, and the differences can be selected according to the requirements of primary signal type, e.g., RF signals, power, or ground, that the structures carry. Traces 196 can also serve to further fan out the signals from a partial space transform that traces 134 provide.

Figure 2B:
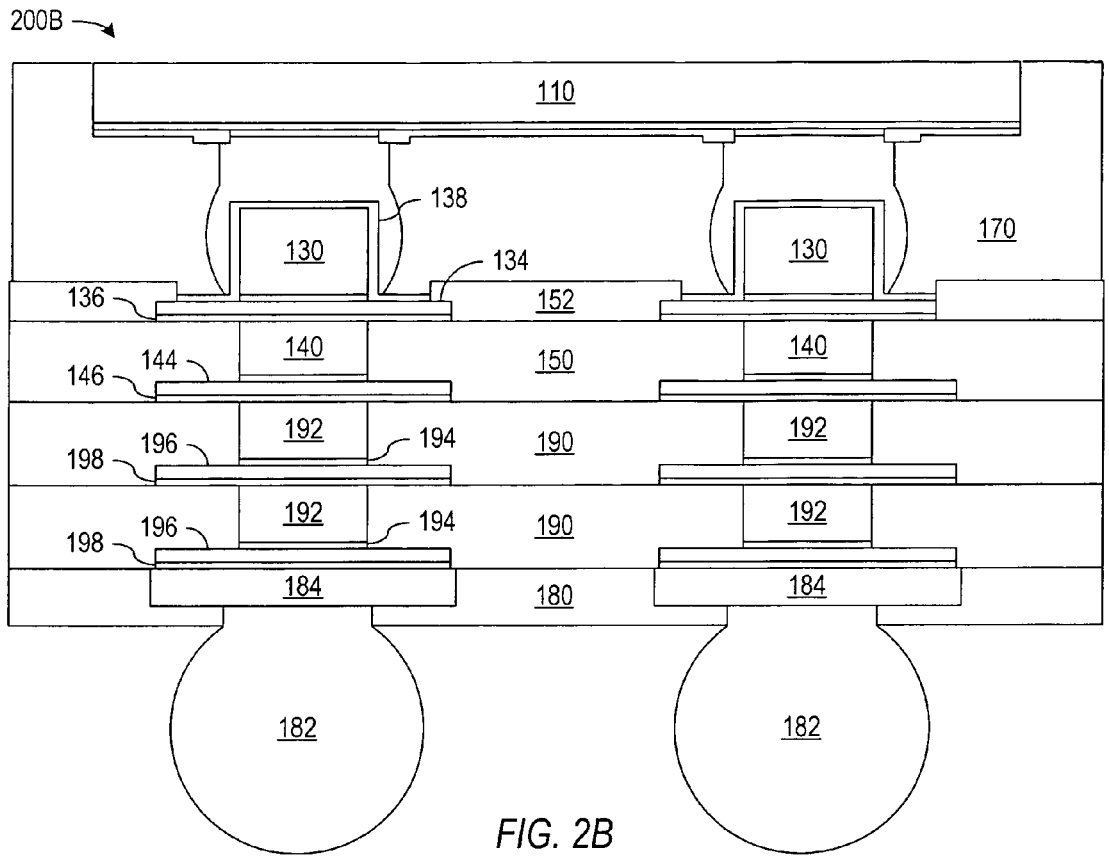

FIG. 2B illustrates a device package 200B in accordance with an embodiment of the invention including an additional interconnect structure having two insulating layers 190 with associated vias and traces 196 that can be formed using conventional techniques.

In accordance with an aspect of the invention, an advanced flip-chip package such as illustrated in FIG. 2A or 2B can include both thin-film traces 134 and 144 and additional traces 196 that are thicker, coarser, and/or less-expensive to fabricate than the thin-film structures. The thin-film structures can achieve finer pitch and closer spacing than more conventional packaging techniques and therefore provide high performance signal transmission in a compact area. The high performance traces 134 and 144 can be employed, for example, for lateral routing of high-frequency or RF signals. The additional interconnect traces 196, which can be made thicker and with a wider spacing and pitch, accommodate lateral routing of supply voltages and for ground management. Some vias 140 through the thin-film structure electrically connect interconnect traces 196 to die 110, and some vias 482 through 400 provide electrical connections from the thin-film structures to external terminals 480. However, the thin-film traces 134 and 144 can be used primarily for lateral routing of signals requiring higher performance, while coarser traces 196 are primarily used for lateral routing of power and ground. Accordingly, a flip-chip package can employ multiple layers of traces having the different structures selected for the specific signals routed.

Figure 3:
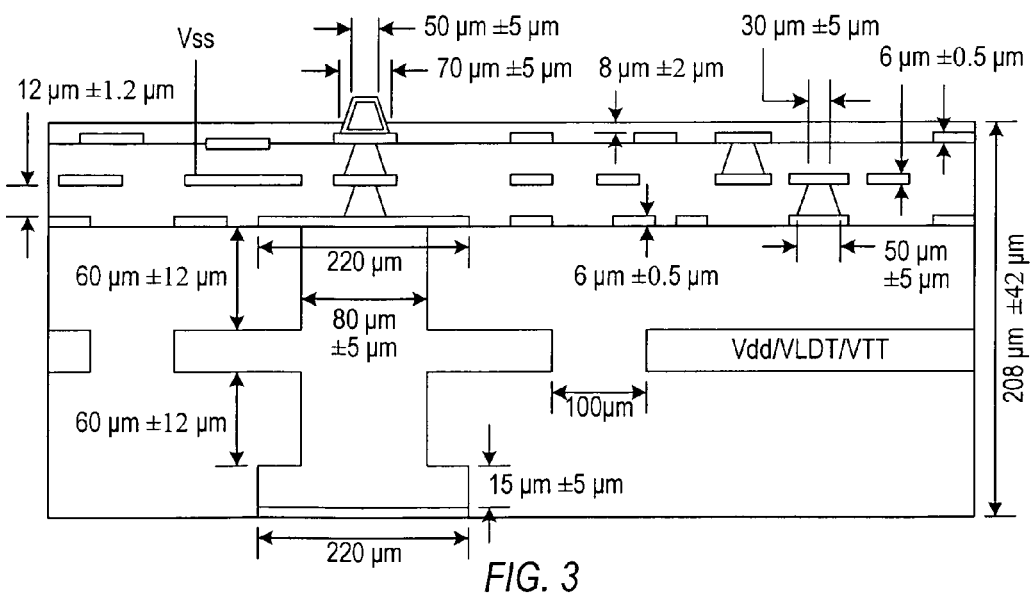
FIG. 3 illustrates typical dimensions in a flip-chip package in accordance with an embodiment of the invention in which technology partitioning uses fine-pitch thin film traces for high frequency signals and coarser pitch for supply voltage and ground management.

FIG. 3 illustrates some typical dimensions in a flip-chip package in accordance with an exemplary embodiment of the invention including both a thin-film interconnect structure and an additional coarser interconnect structure. For example, the thin-film interconnect structure can be built using insulating layers about 12 to 18 μm thick, conductive layers about 6 μm thick, and pads or traces about 50 to 70 μm wide. The coarser interconnect structure in contrast uses insulating layers about 60 to 75 μm thick, conductive layers about 15 μm thick, and pads, plugs, and traces that are about 80 to 200 μm or more wide.

Figure 4:
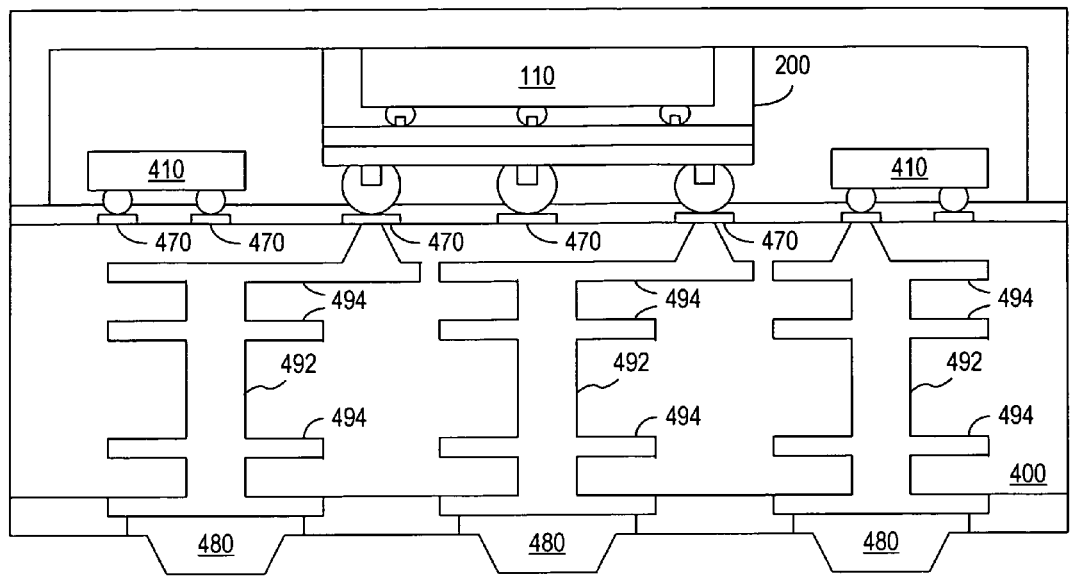
FIG. 4 illustrates an embodiment of the invention including a flip chip package having thin film traces and coarse traces that are connected to an interconnect core.

FIG. 4 illustrates a multi-chip device package in accordance with an embodiment of the invention in which a flip-chip package 200 containing a thin-film interconnect structure is attached to a core 400. Core 400 includes surface pads/traces 470, internal traces 494, and vias 492 that connect flip-chip package 200 to external terminals 480 and optionally to other semiconductor dies 410. Conventional fabrication techniques can fabricate core 400 from insulating materials such as polyimide/glass or polyimide/composite with copper traces and vias. Core 400 is preferably fabricated using a buildup technology rather than a laminate technology as is used in printed circuit boards. Core 400 provides yet another level of interconnect structure to the thin-film and any additional coarser interconnect structures within package 200. An advantage of the packaging of FIG. 4 is that the thin-film structures cover a relatively small area when compared to the area of core 400. The smaller area of thin-film structures makes production cost less than would be required for a package in which thin-film structures covered the entire area corresponding to the footprint of core 400. Additionally, allowing thin film structure in package 200 to perform routing functions between cells (i.e., CPU to memory to logic to graphic circuits) in die 110 can reduce the required die size and reduce the die layer count possibly resulting in a significant cost savings during fabrication of die 110.

Figure 5:
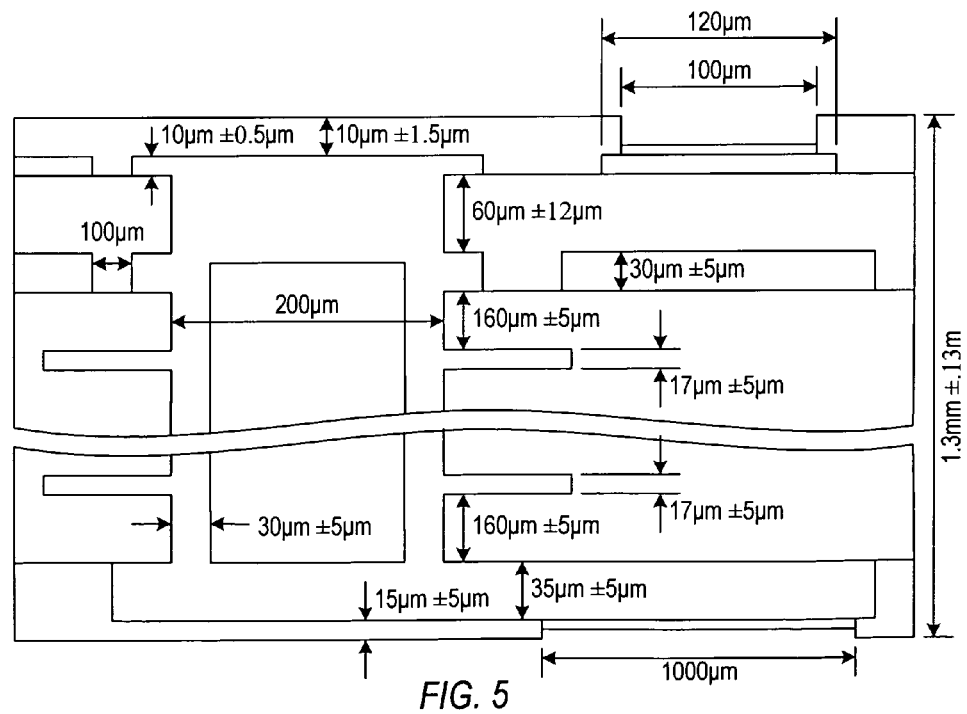
FIG. 5 illustrates typical dimensions for a package of the type illustrated in FIG. 4.

FIG. 5 illustrates typical dimensions of structures in core 400 in an exemplary embodiment of the invention. In particular, core 400 can include pads 470 about 100 to 120 μm wide for connection to the terminals of package 200 and pads about 1000 μm wide for terminals 480 forming an external BGA. The overall thickness of core 400 can be on the order of about 1 to 1.3 mm with each insulating layer within core 400 being about 160 to 180 μm, each trace layer about 17 μm thick, and vias about 30 to 200 μm thick.

Figure 6A:
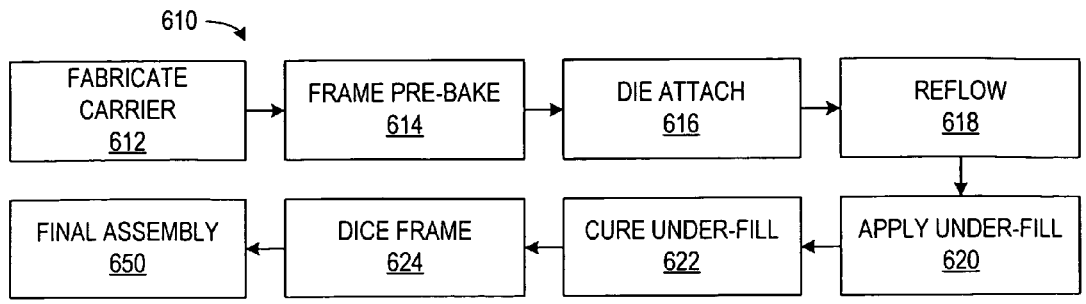
FIGS. 6A, 6B, and 6C illustrate a process flow for fabrication of the device of FIG. 4.
Figure 6B:
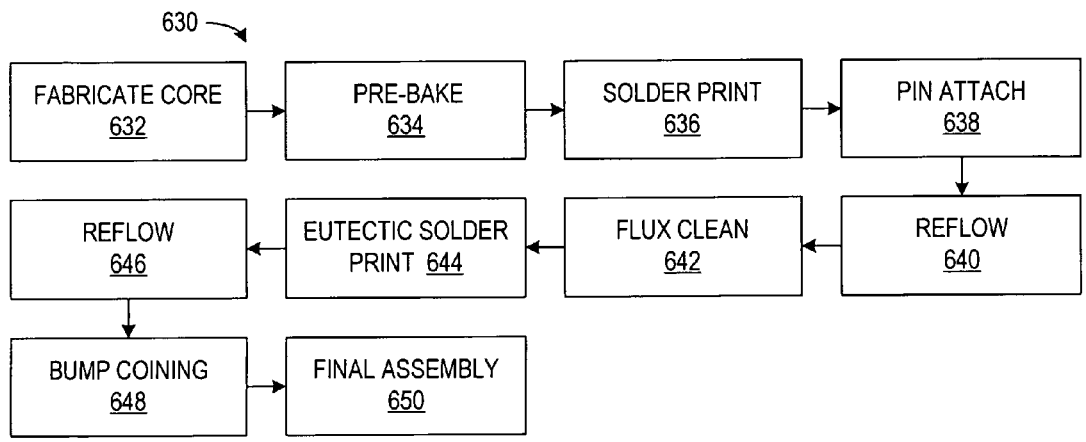
Figure 6C:
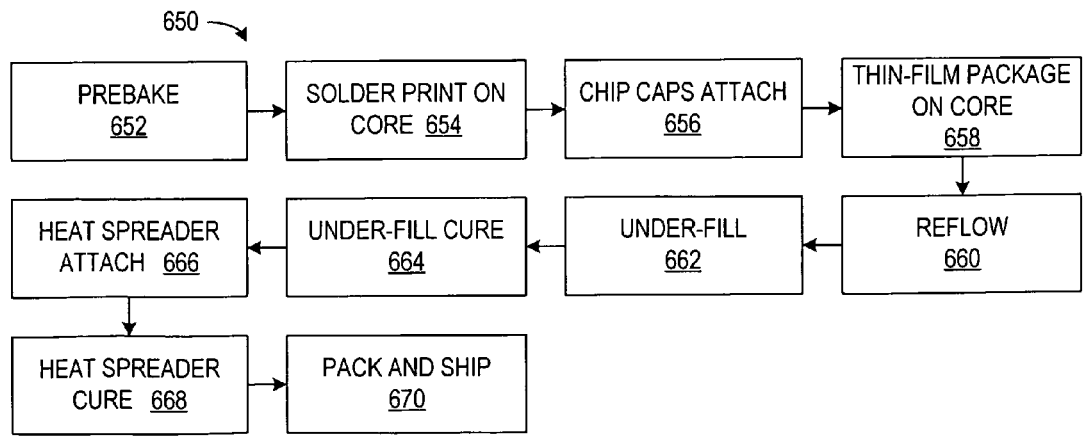

FIGS. 6A, 6B, and 6C illustrate a process for fabrication of package of FIG. 4. FIG. 6A illustrates a process 610 for readying package 200. Process 610 includes a step 612 of fabricating a carrier as described above including thin-film interconnect structures and optional coarser interconnect structures for multiple packages. During fabrication step 612, a patterned etch can remove portions of the carrier, and bottom terminals (e.g., BGAs) can be formed in areas where the sacrificial layer was removed. The patterned etch leaves a frame of the sacrificial material for handling of the interconnect structures. A carrier pre-bake step 614 ensures removal of any moisture before a die attach step 616 aligns semiconductor dies with bumps in corresponding package areas of the carrier. A reflow process 618 then attaches the dies to the respective package areas, and steps 620 and 622 apply and cure an under-fill material. The carrier can then be diced in step 624 to remove the frame and separate individual device packages for use in a final assembly process 650.

FIG. 6B illustrates a process 630 for core preparation. Initially, a conventional fabrication process 632 fabricates a core such as described above in regards to FIGS. 4 and 5. Optionally, step 634 pre-bakes the core to remove moisture, before solder print step 636, pin attach step 638, and reflow step 640 apply solder and pins or other external terminals to pads on the core and then reflow the printed solder to attach the pins. Step 642 can then clean the structure. Solder print step 644, reflow step 646, and bump coining step 648 form bumps where required on the core before the final assembly process 650.

FIG. 6C illustrates a final assembly process 650 that attaches the package structure including the thin-film interconnects to the core. Assembly process 650 optionally begins with pre-bake step 652. Solder print step 654 and cap attach step 656 attach capacitors or other devices to the core. Steps 654 and 656 are optional in that the steps may be used in the packaging of certain complex devices, for example, a microprocessor, but may be unnecessary for less complex packages. Step 658 aligns the thin-film package structure for a reflow step 660 that attaches the thin-film package structure to the core. Application step 662 and curing step 664 apply and cure a fill material between the thin-film package structure and the core. If desired, steps 666 and 668 can apply and cure an adhesive that attaches a heat spreader before the finished product is packed and shipped.

Figure 7:
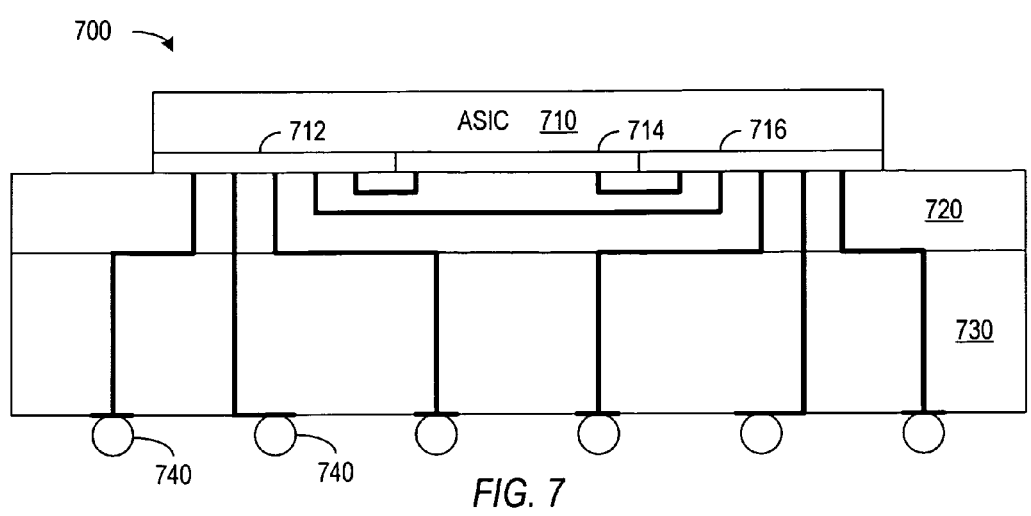
FIG. 7 shows a package in accordance with an embodiment of the invention in which a package structure routes signals between functional units in an integrated circuit die.

FIG. 7 illustrates another aspect of the invention where the high performance of thin film packaging structures 720 are employed to relay signals between different functional units 712, 714, and 716 of a configurable ASIC 710. In this embodiment, traces in thin-film structure 720 provide input and output of the high frequency signals required for the ASIC 710 and busses for signals (high frequency or otherwise) that are transmitted between functional units 712, 714, and 716. Space transformation from the pitch of the contacts on ASIC 710 to the pitch or external terminals 740 and power and ground management can be mostly implemented in a coarser interconnect structure 730.

Although the invention has been described with reference to particular embodiments, the description is only an example of the invention's application and should not be taken as a limitation. Various adaptations and combinations of features of the embodiments disclosed are within the scope of the invention as defined by the following claims.

What is claimed is:

1. A packaging process comprising:
   fabricating a thin-film interconnect structure overlying a carrier, wherein the thin-film interconnect structure is fabricated using a first process providing a first minimum dimension for traces; and
   attaching a die to the thin-film interconnect structure;

removing at least a portion of the carrier under the thin-film interconnect structure;

fabricating a second interconnect structure using a second process that provides a second minimum dimension for traces, the second minimum dimension being greater than the first minimum dimension; and fabricating external terminals that are under and electrically connected to the thin-film interconnect structure.

2. The process of claim 1, wherein fabricating the thin-film interconnect structure comprises:

depositing a conductive layer on the carrier;

photolithographically patterning the conductive layer to form first conductive traces;

depositing an insulating layer on the conductive traces; and forming conductive vias through the insulating layer to electrically contact the first conductive traces.

3. The process of claim 2, wherein fabricating the thin-film interconnect structure further comprises:

depositing a second conductive layer on the insulating layer and the conductive vias; and patterning the second conductive layer to form second conductive traces.

4. The process of claim 2, wherein the die electrically connects to the first conductive traces through the conductive vias.

5. The process of claim 1, wherein attaching the die comprises a flip-chip bonding process that electrically connects the die to pads formed in the thin film interconnect structure.

6. The process of claim 1, wherein removing the portion of the carrier leaves a remaining portion of the carrier, the remaining portion forming a frame that is attached to the thin-film interconnect structure.

7. The process of claim 1, wherein the thin-film interconnect structure provides routing of signals of the die, and the second interconnect structure provides routing of power for the die.

8. A packaging process comprising:

fabricating a thin-film interconnect structure overlying a carrier;

removing at least a portion of the carrier under the thin-film interconnect structure, wherein removing the portion of the carrier leaves a remaining portion of the carrier, the remaining portion forming a frame that is attached to the thin-film interconnect structure;

attaching a die to the thin-film interconnect structure, wherein attaching the die is performed after removing the portion of the carrier; and fabricating external terminals that are under and electrically connected to the thin-film interconnect structure.

9. The process of claim 8, further comprising removing the frame during a dicing process that produces a separated package containing the die.

10. A packaging process comprising:

fabricating a thin-film interconnect structure overlying a carrier;

attaching a die to the thin-film interconnect structure;

removing at least a portion of the carrier under the thin-film interconnect structure;

forming a second interconnect structure on an area of the thin-film interconnect structure exposed by removing the portion of the carrier; and fabricating external terminals that are under and electrically connected to the thin-film interconnect structure, wherein the external terminals are on the second interconnect structure.

11. The process of claim 10, wherein forming the second interconnect structure comprises:

applying an insulating tape to the thin-film interconnect structure; and fabricating conductive traces and vias on and through the insulating tape.

12. A packaging process comprising:

fabricating a first interconnect structure using a first process providing a first minimum dimension for traces, wherein the first interconnect structure provides routing of signals of a device; and fabricating a second interconnect structure using a second process providing a second minimum dimension for traces, the second minimum dimension being greater than the first minimum dimension, wherein the second interconnect structure provides routing of power for the device.

13. The process of claim 12, wherein the first interconnect structure further routes signals between functional units of the device.

14. The process of claim 12, wherein forming the first interconnect structure comprises:

depositing a conductive layer overlying a carrier;

photolithographically patterning the conductive layer to form first conductive traces;

depositing an insulating layer on the conductive traces; and forming conductive vias through the insulating layer to electrically contact the first conductive traces.

15. The process of claim 14, wherein forming the second interconnect structure comprises:

applying an insulating tape to the thin-film interconnect structure; and fabricating conductive traces and vias on and through the insulating tape.

16. The process of claim 15, wherein the insulating tape is applied to the carrier, and the first interconnect structure is formed on the second interconnect structure.

17. The process of claim 14, wherein forming the second interconnect structure comprises:

removing a portion of the carrier;

applying an insulating tape to an area of the first interconnect structure that removal of the portion of the carrier exposes; and fabricating conductive traces and vias on and through the insulating tape.

* * * * *